United States Patent
Jakschik et al.

(10) Patent No.: US 7,842,977 B2
(45) Date of Patent: Nov. 30, 2010

(54) GATE ELECTRODE STRUCTURE, MOS FIELD EFFECT TRANSISTORS AND METHODS OF MANUFACTURING THE SAME

(75) Inventors: Stefan Jakschik, Leuven (BE); Thomas Hecht, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/675,460

(22) Filed: Feb. 15, 2007

(65) Prior Publication Data

US 2008/0197428 A1    Aug. 21, 2008

(51) Int. Cl.
*H01L 29/78* (2006.01)
(52) U.S. Cl. .............. 257/213; 257/412; 257/E29.13; 257/E29.255
(58) Field of Classification Search .......... 257/18, 257/20, 249, 250, 412, E29.193, 302, 331, 257/381, 213; 438/197
See application file for complete search history.

(56) References Cited

U.S. PATENT DOCUMENTS

| | | | |
|---|---|---|---|
| 5,625,217 A | 4/1997 | Chau et al. | |
| 6,740,913 B2 | 5/2004 | Doyle et al. | |
| 6,812,515 B2* | 11/2004 | Rabkin et al. | 257/315 |
| 6,894,337 B1* | 5/2005 | Wang et al. | 257/302 |
| 7,208,793 B2* | 4/2007 | Bhattacharyya | 257/314 |
| 2003/0129795 A1 | 7/2003 | Chau et al. | |
| 2004/0061150 A1 | 4/2004 | Cho et al. | |
| 2005/0040477 A1* | 2/2005 | Xiang et al. | 257/410 |
| 2006/0237796 A1* | 10/2006 | Cartier et al. | 257/371 |
| 2007/0200179 A1* | 8/2007 | Chen | 257/369 |
| 2007/0272975 A1* | 11/2007 | Schaeffer et al. | 257/327 |

* cited by examiner

*Primary Examiner*—David Vu
*Assistant Examiner*—Suberr Chi
(74) *Attorney, Agent, or Firm*—Edell, Shapiro & Finnan, LLC

(57) ABSTRACT

A gate electrode structure comprises at least one bi-layer, wherein each bi-layer comprises a plating film and a stress amplifier film. The plating film includes a poly-crystalline material. The stress amplifier film determines the crystallization result of the poly-crystalline material, wherein a mechanical stress induced through the plating layer is amplified. Tensile or compressive strain may be induced in a crystalline substrate. Electron or hole mobility may be increased and on-resistance characteristics of a MOS field effect transistor may be improved.

22 Claims, 11 Drawing Sheets

GATE ELECTRODE STRUCTURE, MOS FIELD EFFECT TRANSISTORS AND METHODS OF MANUFACTURING THE SAME

BACKGROUND

So-called strained-silicon techniques improve the performance of MOS field effect transistors by applying tensile or compressive stress to a channel region to enhance the charge carrier mobility. The mobility of electrons or holes in the channel region influences for example the on-resistance $R_{DSon}$ between source and drain in the conductive state of the transistor.

Strained silicon may be provided by epitaxial growth of silicon over a single crystal SiGe layer, wherein the silicon lattice is strained due to a differing lattice constant in the SiGe layer.

Further methods use mechanical stress induced by neighboring structures being densified by outgassing volatile components after deposition or by neighboring structures incorporating material from a gas-phase after solidification.

A general need exists to control charge carrier mobilities in silicon based devices by inducing strain into a silicon substrate.

SUMMARY

A gate electrode structure comprises at least one bi-layer, wherein each bi-layer comprises a plating film and a stress amplifier film. The plating film includes a poly-crystalline material. The stress amplifier film determines the crystallization result of the poly-crystalline material, wherein a mechanical stress induced through the plating layer is amplified. Tensile or compressive strain may be induced in a crystalline substrate. Electron or hole mobility may be increased and on-resistance $R_{DSon}$ characteristics of a MOS field effect transistor may be improved.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The gate electrode structure, MOS field effect transistors and methods of manufacturing the same are explained in more detail below with reference to exemplary embodiments, where.

DETAILED DESCRIPTION

Figure 1A:
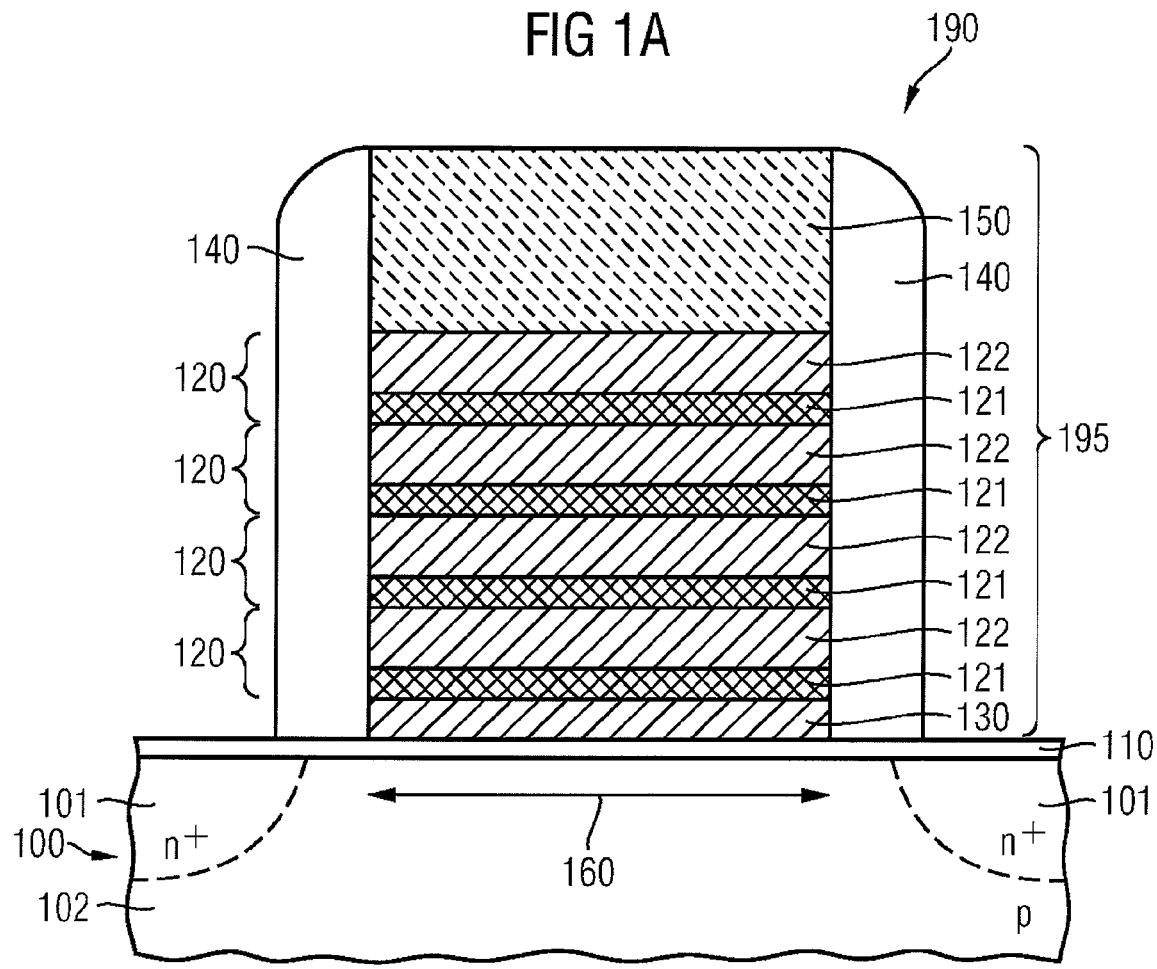
FIG. 1 shows a schematic cross-sectional view of a gate electrode structure and a n-channel MOSFET according to an embodiment.

The embodiments, described herein, refer to a gate electrode structure and to a MOS field effect transistor. Further embodiments, described herein, relate to methods of manufacturing a gate electrode structure and a MOS field effect transistor.

Details and advantages of embodiments will become apparent upon consideration of the following definitions, descriptions and descriptive Figures. While these descriptions go into specific details of embodiments, it should be understand that variations may and do exist and would be apparent to those skilled in the art based on the description herein.

An embodiment provides a gate structure that comprises at least two bi-layers, wherein each bi-layer comprises a plating film and a stress amplifier film. The plating film comprises a polycrystalline material. The stress amplifier film determines a crystallization result of the polycrystalline material, wherein a mechanical stress induced by the plating layer is amplified. The bi-layers are arranged to form a laminated film stack with stress amplifier and plating films in alternating order.

A further embodiment provides an n-channel MOS field effect transistor that comprises a gate electrode structure including a bi-layer. The bi-layer includes a polycrystalline film and a stress amplifier film. The stress amplifier film determines a crystallization result of the polycrystalline film, wherein a tensile strain induced by the bi-layer in a channel region of the n-MOSFET is amplified.

A further embodiment provides a p-channel MOS field effect transistor that comprises a gate electrode structure including a bi-layer. The bi-layer includes a polycrystalline film and a stress amplifier film. The stress amplifier film determines a crystallization result of the polycrystalline film, wherein a compressive strain induced by the bi-layer in a channel region of the p-MOSFET is amplified.

A further embodiment is related to a method of manufacturing a gate electrode structure. A stress amplifier film is provided. The stress amplifier film is capable of determining a crystallization result of a precursor material that is deposited on the stress amplifier film. A crystallization process is performed to form a plating film of a polycrystalline material from the precursor material. The precursor material crystallizes, wherein a mechanical stress that is induced in the plating layer by the plating film is amplified. Providing a stress amplifier film, depositing a precursor material and performing a crystallization process are repeated at least one time.

A further embodiment provides another method of manufacturing a gate structure. A stress amplifier film is provided that is capable of determining a crystallization result of a poly-crystalline film deposited on the stress amplifier film. A precursor material is deposited on the stress amplifier film. The processes of providing a stress amplifier film and depositing a precursor material on the stress amplifier film are repeated at least one time. A crystallization process is performed to form plating films of polycrystalline material, wherein the polycrystalline material crystallizes and wherein a mechanical stress induced in the plating film is amplified.

In the following paragraphs, exemplary embodiments of the described device and method are described in connection with the figures.

FIG. 1A is an illustration of an embodiment of a gate electrode structure 195 as well as a MOS field effect transistor 190 comprising the gate electrode structure 195. The gate electrode structure 195 may comprise a plurality of bi-layers 120, wherein each bi-layer comprises a stress amplifier film 121 and a plating film 122 that is disposed on the stress amplifier film 121. The bi-layers 120 are arranged to form a laminated film stack with the stress amplifier films 121 and the plating films 122 in alternating order. An insulating cap layer 150, for example a silicon nitride layer, may cover the laminated film stack. Insulating sidewall spacers 140, for example silicon oxide spacers or silicon nitride spacers, may cover vertical sidewalls of the laminated film stack. The gate electrode structure 195 may be provided on a pattern surface of a semiconductor substrate 100. Within the semiconductor substrate 100, n-doped impurity regions may form source/drain-regions 101 of the MOS field effect transistor 190. The gate electrode structure 195 is disposed above a p-doped channel region 102 that separates the two source/drain-regions 101. A gate dielectric 110 may separate the gate electrode structure 195 and the channel region 102.

According to exemplary embodiments, both the plating films 122 and the stress amplifier films 121 may be conductive. According to other embodiments, either the plating films 122 or the stress amplifier films 121 may be conductive and the other non-conductive. Different materials may be provided for the plating films 122 of the same gate electrode structure 195 as well as for the stress amplifier films 121 of the same gate electrode structure 195. Materials of the stress amplifier films 121 may be, for example, conductive metal compounds, ceramic materials or non-conductive metal oxides.

According to an exemplary embodiment, the plating films 122 may comprise or consist of a polycrystalline material such as polycrystalline silicon (polysilicon). The stress amplifier films 121 may comprise or consist of amorphous carbon, for example pyrolytic carbon resulting from the thermal decomposition of a carbon hydrogen compound, e.g., acetylene $C_2H_2$, ethylene $C_2H_4$, propane $C_2H_6$. The stress amplifier films 121 and the plating films 122 are provided in alternating order. The plating films 122 may be provided by depositing an amorphous or polycrystalline precursor material. In course of a following temper step, the precursor material of the plating film crystallizes or re-crystallizes. The surface of the stress amplifier film affects the crystallization or re-crystallization process such that a strain induced in the stress amplifier film by the polysilicon film is higher, for example at least by factor 2, than could be expected from the inherent bulk stress caused by the deposition of the stress amplifier film and the precursor material.

This stress amplifier effect results from an interface effect between a suitable underlayer and an appropriate precursor material.

Further with regard to FIG. 1A, the mechanical strain induced by each bi-layer 120 is summed up and may generate a resulting tensile strain 160 in the channel region 102. The tensile strain 160 increases the electron mobility in the channel region 102. The On-resistance of the transistor MOS field effect 190 in the conductive state may be reduced.

The gate electrode structure 195 may further comprise an electrode film 130 separating the gate dielectric 110 and the first bi-layer 120. For an n-channel MOS field effect transistor, a layer which is in contact with the gate dielectric 110 should be provided of a material with a work function of 3.8 to 4.3 eV, e.g., about 4.1 eV. The electrode film 130 may be an n-doped polysilicon layer and decouples the requirements regarding the work function on one hand and regarding the stress amplifier properties on the other hand. Another suitable material for the electrode film 130 may be $Ta_2C$.

The material of the plating films 122 is for example heavily doped polysilicon wherein the dopant concentration is sufficient to ensure an ohmic contact to the conductive stress amplifier films 121 and may exceed, e.g., $10^{19}$ cm$^{-3}$. In case of a doped polysilicon layer as electrode film 130, the dopant concentration may exceed, e.g., $10^{20}$ cm$^{-3}$. The stress amplifier films 121 may have a thickness of 2 to 10 nm, e.g., 5 nm. The plating layers may have a thickness of 10 to 100 nm, e.g., 20 nm. The number of bi-layers 120 may range from 2 to 10, and may be for example 5.

Figure 1B:
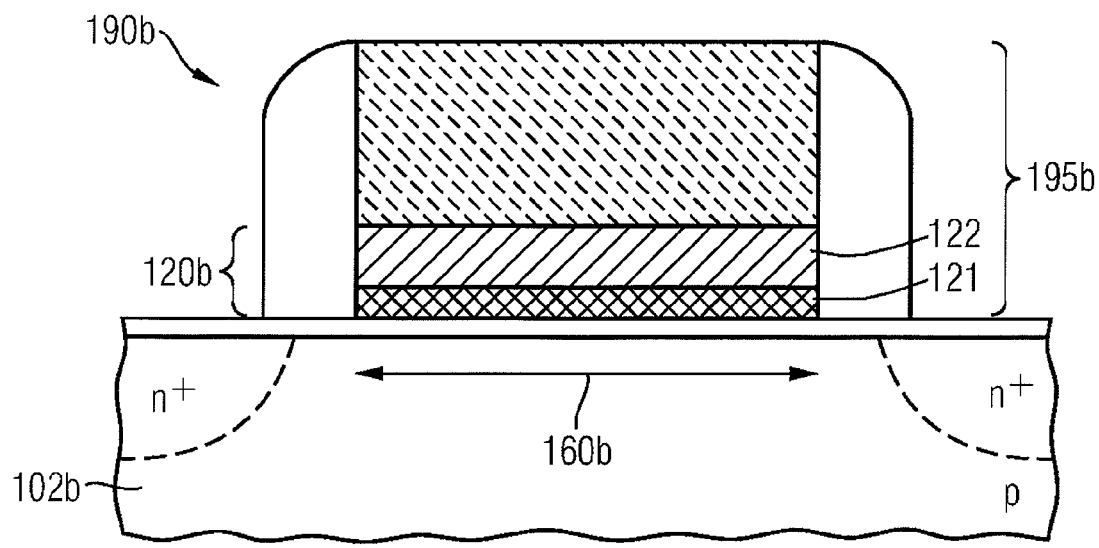

FIG. 1B illustrates an n-channel MOSFET 190b comprising a gate electrode structure 195b including one bi-layer 120b that induces tensile strain 160b in a channel region 102b of the MOSFET 190b.

Figure 2A:
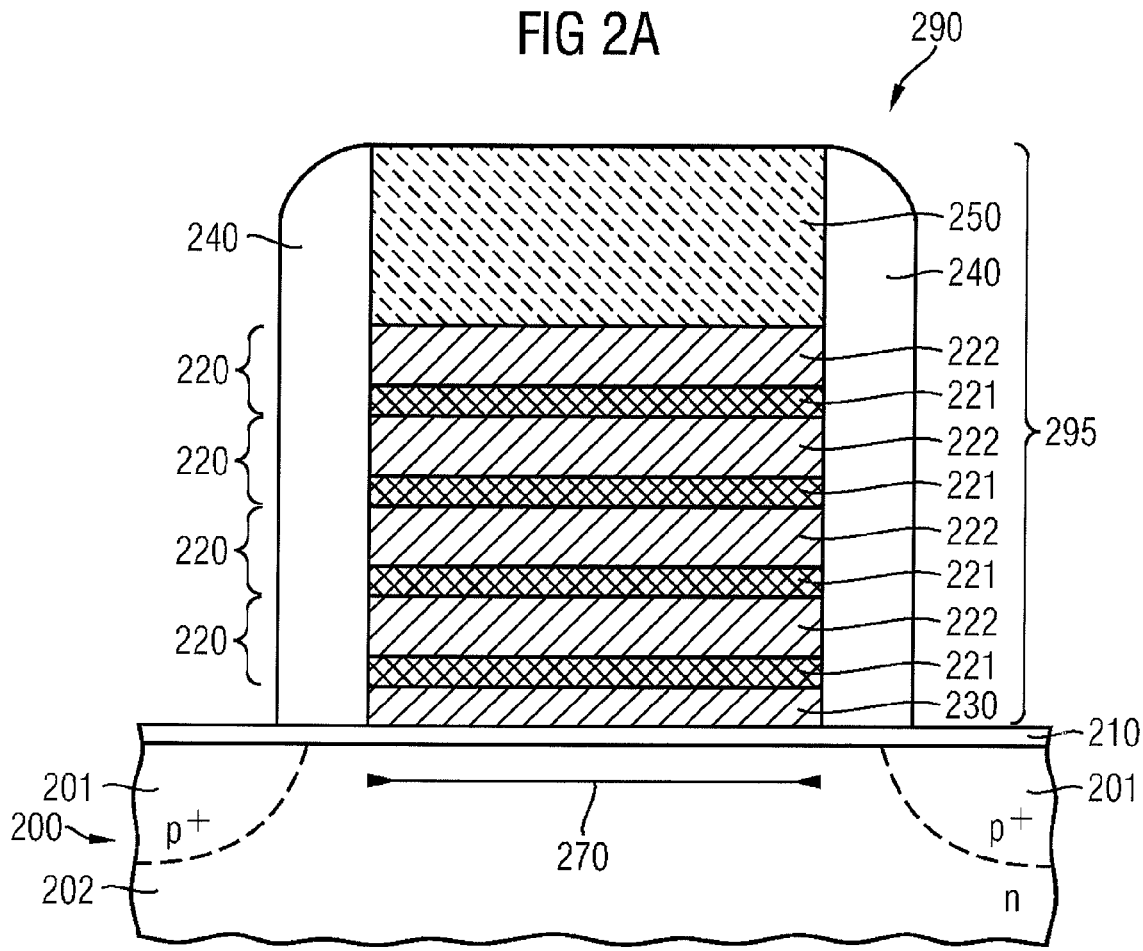
FIG. 2 is a schematic cross-sectional view of a gate electrode structure and a p-channel MOSFET with a polysilicon gate according to another embodiment.

FIG. 2A refers to a gate electrode structure 295 and a p-channel MOSFET 290. The gate electrode structure 290 comprises bi-layers 220, wherein each bi-layer 220 includes a stress amplifier film 221 and a plating film 222. The stress amplifier film and the plating films 221, 222 are arranged in alternating order to form a laminated film stack. An insulating capping layer 250, for example a silicon nitride layer, covers the top bi-layer 220 and sidewall structures 240 extend along vertical sidewalls of the laminated film stack. The stress amplifier films 221 comprise, for example, a conductive material and may comprise a conductive titanium, tantalum, zirconium or hafnium compound, e.g., titanium nitride TiN.

In dependence on the orientation of the channel axis to the crystal axes, for example if the channel axis is parallel to the <110> crystal axis of a single crystalline silicon substrate, also tensile strain in a direction that is transverse or orthogonal to the channel axis may enhance the mobility of holes in a channel region 202 of the p-channel MOSFET 290. If such an enhancement effect due to transverse tensile strain dominates over a deterioration of the mobility of holes due to parallel tensile strain, for example if a channel width/length ratio exceeds a predetermined relation given from the longitudinal mobility/transverse mobility ratio, the bi-layer systems of an n-channel MOSFET may also be applied to p-channel MOSFETs, for example in order to simplify fabrication of integrated circuits comprising both n-channel and p-channel MOSFETs. The stress amplifier films 221 may then comprise amorphous carbon, for example pyrolytic carbon resulting from the thermal decomposition of a carbon hydrogen compound, e.g., acetylene $C_2H_2$, ethylene $C_2H_4$, propane $C_2H_6$ or others.

The plating films 222 and the stress amplifier films 221 may be conductive. According to other embodiments, either the plating films or the stress amplifier films may be conductive and the other non-conductive. Different materials may be provided for the plating films 222 of the same gate electrode structure 295 as well as for the stress amplifier films 221 of the same gate electrode structure 295. The material of the stress amplifier films 221 may be a conductive metal compound or a ceramic material such as a non-conductive metal oxide.

According to an exemplary embodiment, the plating films 222 may comprise a polycrystalline material, e.g., heavily p-doped or heavily n-doped polysilicon. Each plating films 222 emanates from a crystallization or re-crystallization process that is performed after deposition of a precursor material on the corresponding stress amplifier layer and that is affected by an interface effect on the surface of the stress amplifier film 221. The precursor material crystallizes or re-crystallizes such that compressive stress is generated that is induced in the corresponding underlayer. Compressive stress is generated at each interface between a plating film 222 and a stress amplifier film 221, in each case resulting in compressive strain in the corresponding stress amplifier film 221. The stress is passed on and accumulates as compressive strain 270 within a channel region 202 between two p-doped impurity regions within a substrate 200. The impurity regions may form the source/drain-regions 201 of the MOS field effect transistor 290. In dependence on the orientation of the lattice axis and the channel axis, the compressive strain 270 may increase or decrease the mobility of holes in the channel region 202.

For a p-channel MOS field effect transistor, the layer confining to the gate dielectric 210 should be made of a material with a work function of 4.4 to 5.3 eV, e.g., about 5.2 eV. A p-doped polysilicon layer may be provided as electrode film 230 between the gate dielectric 210 and the bottom bi-layer 220 to decouple the requirements concerning the work function for p-channel MOSFETs and the stress amplifier effect. Another suitable material for the electrode film 230 may be titanium nitride TiN, such that the electrode film 230 may be omitted in other embodiments. Further suitable materials are oxides as for example TaCNO, WO, MoO and RuO of different oxidation states and oxygen content respectively.

Figure 2B:
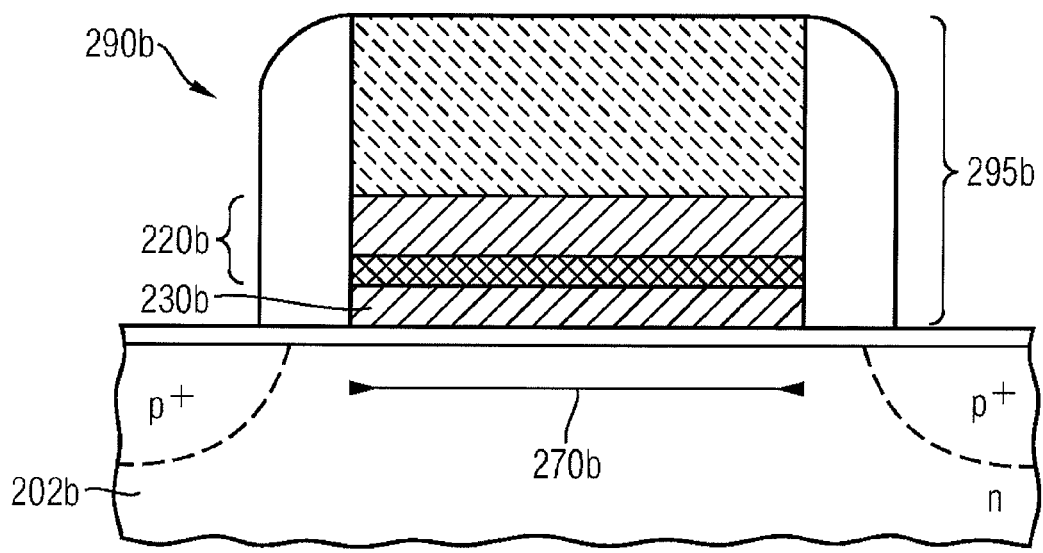

FIG. 2B illustrates a p-channel MOSFET 290b comprising a gate electrode structure 295b including an electrode film 230b and one bi-layer 220b that induces compressive strain 270b in a channel region 202b of the MOSFET 290b.

Figure 3:
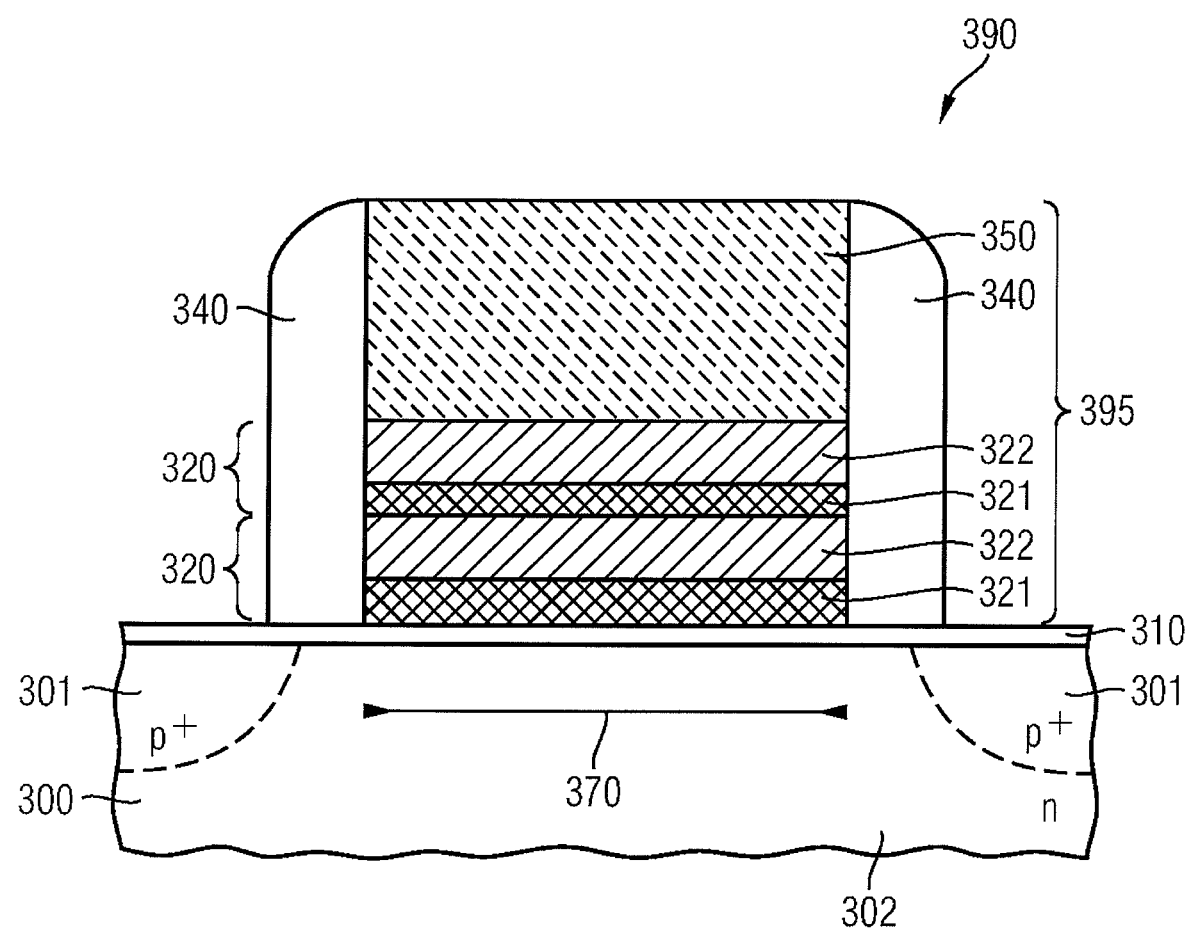
FIG. 3 is a schematic cross-sectional view of a gate electrode structure and a p-channel MOSFET comprising a metal gate according to a further embodiment.

FIG. 3 refers to further embodiments of a gate structure 395 and a MOS field effect transistor 390. The gate electrode structure 395 may comprise two bi-layers 320, wherein each bi-layer 320 includes a stress amplifier film 321 and a plating film 322. The bi-layers 320 are arranged to form a laminated film stack with the stress amplifier films 321 and plating films 322 in alternating order. An insulating cap layer 350 may be disposed on top of the laminated film stack. Vertical sidewall spacers 340 may extend along the vertical sidewalls of the laminated film stack. The gate electrode structure 395 may be disposed above an n-doped channel region 302 that is formed within a substrate 300. The channel region 302 separates two $p^+$-doped impurity regions in the semiconductor substrate 300 that may form source/drain-regions 301 of a p-channel MOS field effect transistor 390. A gate dielectric 310 may be disposed between a bottom stress amplifier layer 321 of the bottom bi-layer 320 and the channel region 302. The material of the bottom stress amplifier film 321 may have a work function of 4.7 to 5.3 eV, e.g., about 5.2 eV and may influence the crystallization process of the poly-crystalline material of the corresponding bottom plating layer 322 such that an amplified compressive strain 370 is induced in the channel region 302.

The electrode film 130 of FIG. 1 may be omitted in a similar way if the stress amplifier film 121 of the bottom bi-layer 120 is made of a material having a work function of 3.8 to 4.3 eV, e.g., about 4.1 eV.

Figure 4A:
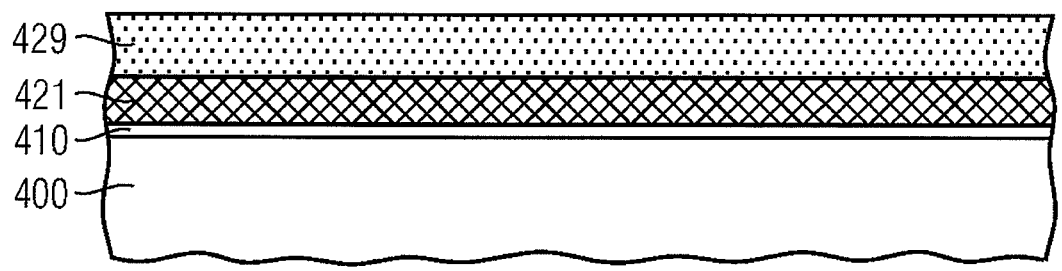
FIGS. 4A and 4B show cross-sectional views of a substrate for illustrating a method of manufacturing a gate electrode structure according to a further embodiment.
Figure 4B:
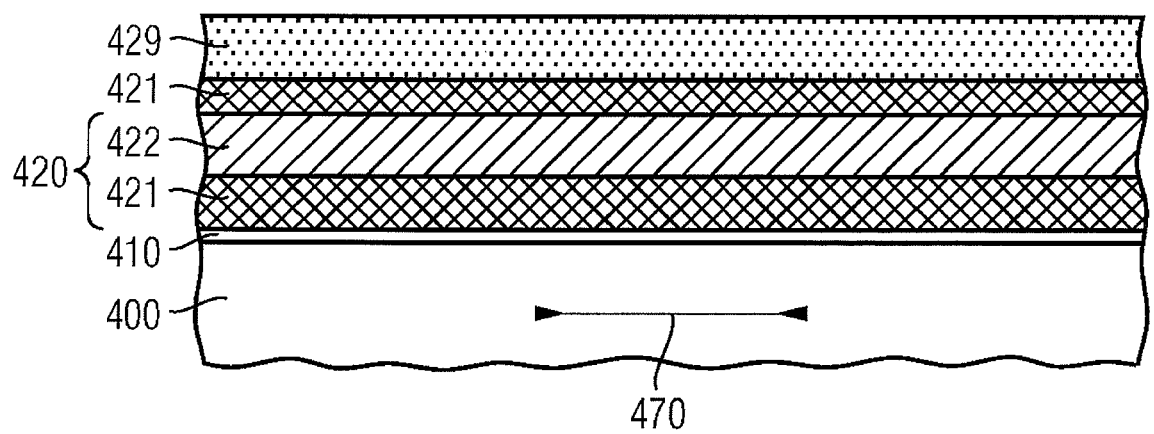

FIGS. 4A to 4B refer to a method of forming a gate electrode structure as well as a MOS field effect transistor. As shown in FIG. 4A, a substrate 400 is provided. The substrate 400 may be a single crystalline silicon substrate, e.g., a semiconductor wafer.

The term substrate, as used in the following paragraphs, is also used to refer to semiconductor structures during processing and may include other layers that have previously been fabricated there. The semiconductor substrate may comprise doped and undoped sections, epitaxial semiconductor layers supported by a base semiconductor or a base insulator, as well as other semiconductor structures.

On a pattern surface of the substrate 400 a gate dielectric 410 is provided. The gate dielectric 410 may be a thermally grown silicon oxide layer. According to other embodiments, the gate dielectric 410 may be, e.g. a deposited silicon oxide, which may be nitrided afterwards, or another oxide or silica oxide of elements of the third or forth group including oxides of rare earth, e.g., $Al_2O_3$, $HfO_2$, $HfSiO_2$, $ZrSiO_2$, $DySiO_2$ or any other high-k material. Above the gate dielectric 410 a first stress amplifier film 421 is deposited. The first stress amplifier film 421 may adjoin the gate dielectric 410 as illustrated in FIG. 4A. According to further examples, an electrode film which comprises a material exhibiting a suitable work function may be provided on the gate dielectric 410 before deposition of the first stress amplifier film 421. The thickness of the stress amplifier film 421 is, e.g., 2 to 10 nm. The stress amplifier film 421 may be a titanium nitride TiN film. A precursor material 429 is deposited on the stress amplifier film 421. The precursor material 429 may be amorphous, partially crystalline or polycrystalline. During deposition or after deposition, a crystallization or re-crystallization process of the precursor material 429 is performed, e.g., via a thermal anneal. Due to an interface effect at the interface between the stress amplifier film 421 and the precursor material 429, a crystallization or re-crystallization process of the precursor material 429 is controlled by the stress amplifier film 421 such that after crystallization/re-crystallization, a plating film 422 as shown in FIG. 4B results from the precursor material 429.

The stress amplifier film 421 and the plating layer 422 form a bi-layer 420. The stress generated via the formation of the plating layer 422 is passed on the adjoining section of substrate 400 resulting in compressive strain 470 in the substrate 400.

It could be shown by the inventors that the amount of strain in the substrate 400 exceeds substantially the amount of stress that could be expected on the basis of conventional stress mechanisms as for example different thermal expansion coefficients of the plating film 422, the stress amplifier film 421 and the substrate 400.

According to FIG. 4B, a further stress amplifier film 421 is deposited on the plating layer 422 and another precursor material 429 is deposited on the second stress amplifier layer 421. The steps of crystallization/re-crystallization of the precursor material to form a plating film 421, depositing a step amplifier film 421 and depositing a further precursor material 429 may be repeated, e.g., up to 10 times.

FIG. 5A to 5D refer to another method of forming a gate electrode structure. On a pattern surface 510 of a substrate 500 an electrode film 530 is deposited that may be formed from a metal compound exhibiting a suitable work function. Precursor films 529 and stress amplifier films 521 comprising in each case the same or different materials are deposited in alternating order on the electrode film 530. The precursor films 529 may have a thickness of 10 to 100 nm. The thickness of the stress amplifier 521 may be 2 to 10 nm.

Figure 5A:
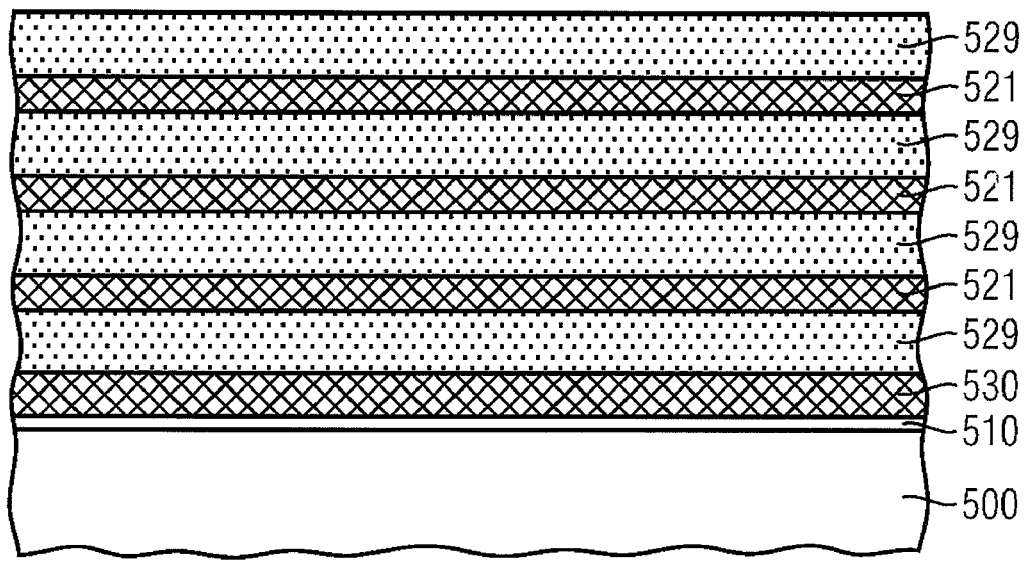
FIGS. 5A-5D show schematic cross-sectional views of a substrate for illustrating a method of manufacturing a gate electrode structure according to another embodiment.
Figure 5B:
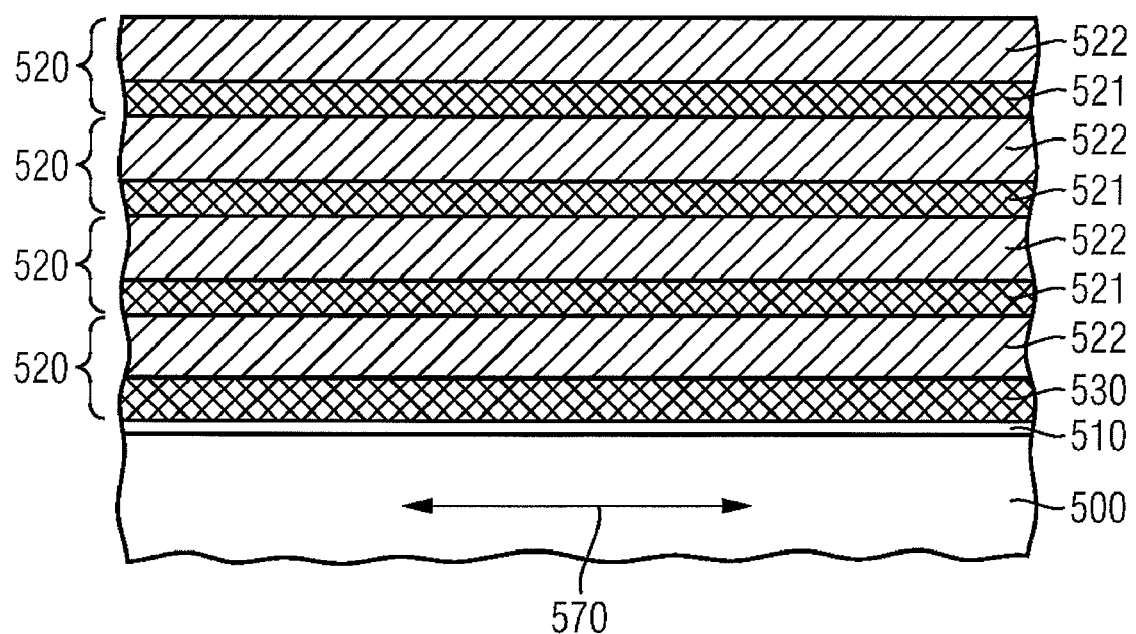

A thermal annealing is performed. As shown in FIG. 5B, the precursor materials of the precursor films 529 crystallize/re-crystallize to form plating films 522. The electrode film 530 and the bottom plating film 522 forms a bottom bi-layer 522. Each pair including a stress amplifier film 521 and a plating film 522 forms further bi-layers 520. The material of the stress amplifier films 521 is for example amorphous pyrolytic carbon resulting from thermal decomposition of a suitable carbon hydrogen compound. In each bi-layer 520 a tensile stress is generated by the re-crystallization process. The stress propagates in each case along the vertical direction. Each bi-layer 520 contributes to a tensile strain 570 in the substrate 500.

Figure 5C:
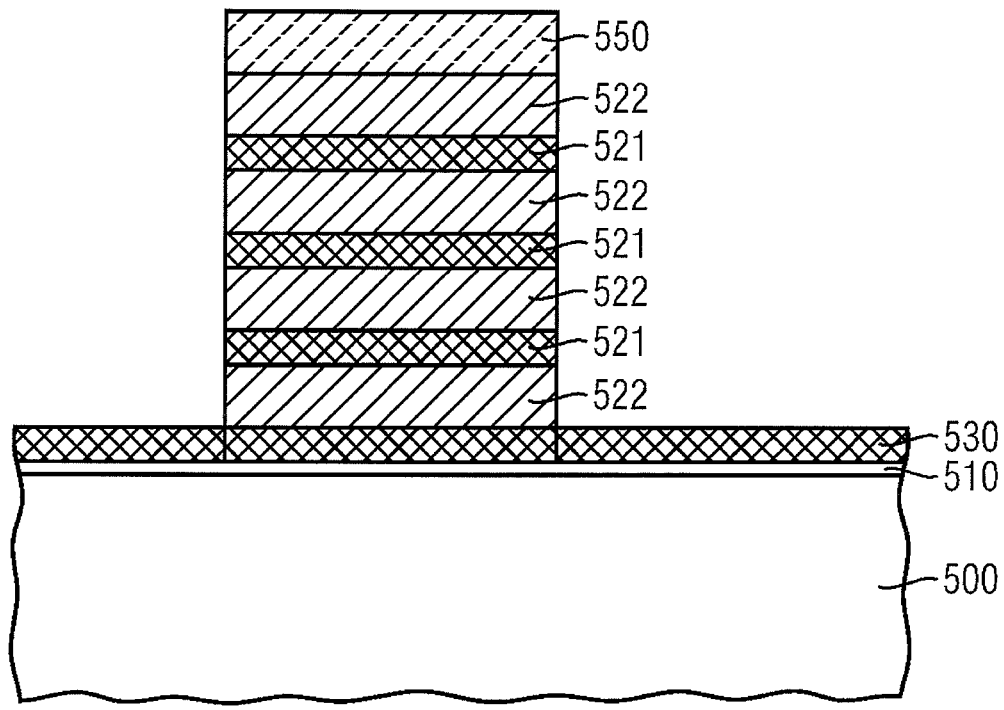
Figure 5D:
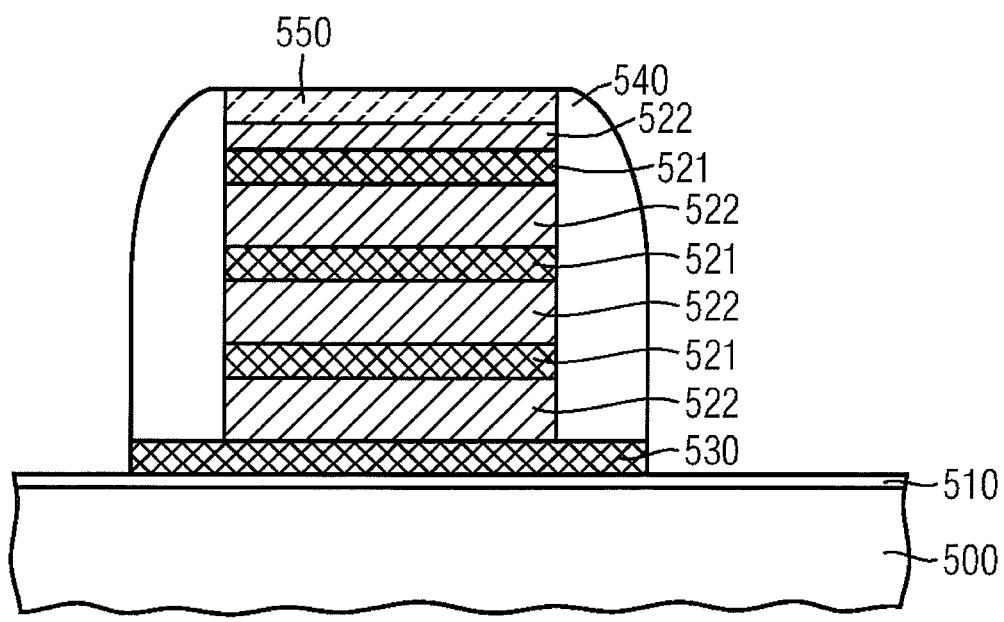

As shown in FIG. 5C, the film stack as illustrated in FIG. 5D is patterned by lithographic techniques. A hard mask layer may be deposited on the top bi-layer 520. A resist (not shown) may be deposited on the hard mask layer and may be patterned by lithographic techniques using the patterned hard mask layer as etch mask. The upper portion of the electrode film may be etched step-wise film by film or in a single, unselective etch step. The etch may stop at the metal electrode film 530.

As shown in FIG. 5D, a sidewall spacer 540 may be provided on the vertical sidewalls of the resulting electrode film stack. The metal electrode film 530 may be etched using the sidewall spacers 540 as an etch mask, thus supporting the formation of well defined metal gates of uniform width.

Figure 6A:
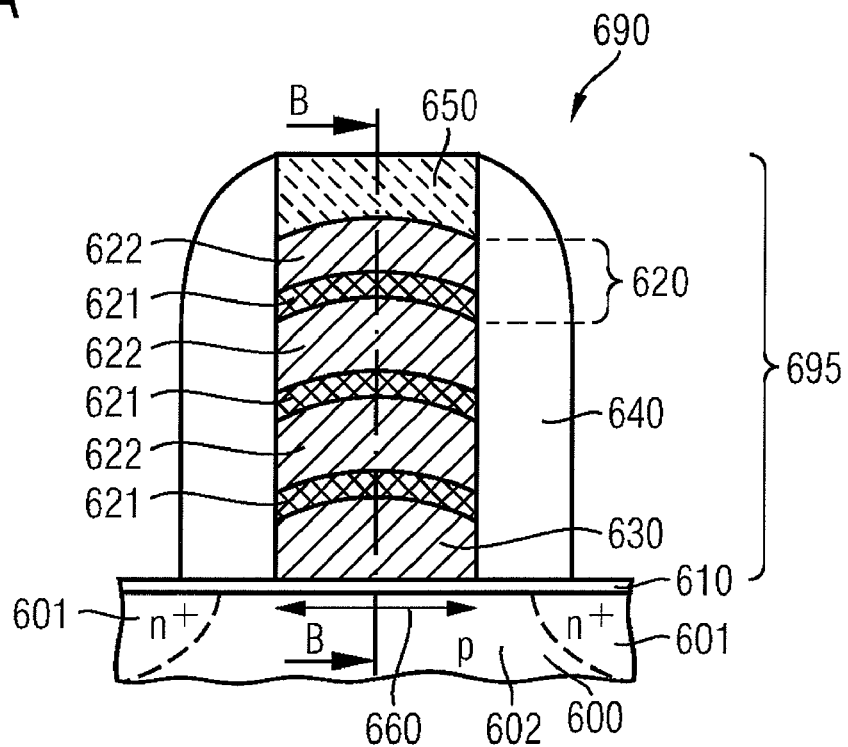
FIGS. 6A and 6B show corresponding cross-sectional views of a gate electrode structure and a MOSFET with plating films bowed along two orthogonal axes according to a further embodiment.
Figure 6B:
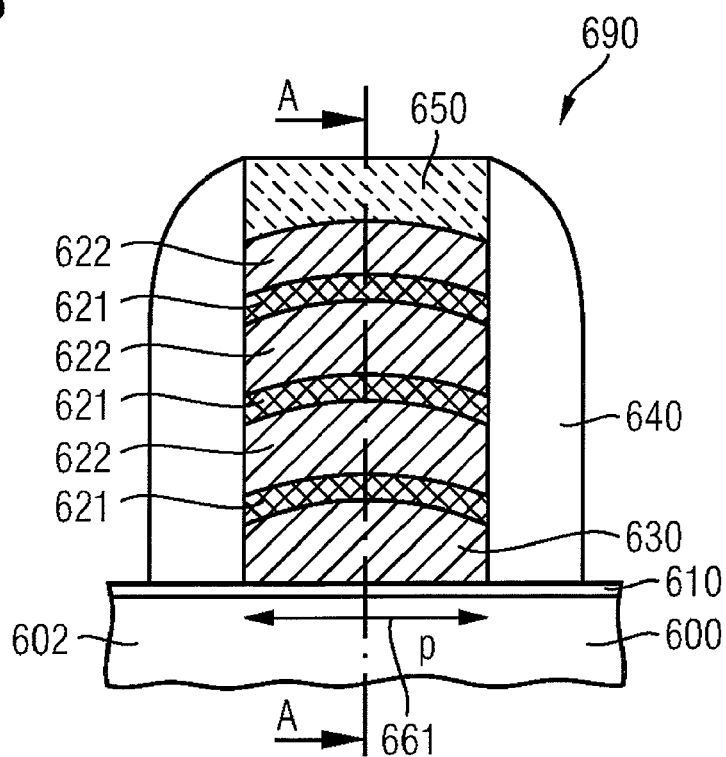

FIGS. 6A and 6B refer to further embodiments of a gate electrode structure and a MOS field effect transistor. The FIGS. 6A and 6B show cross-sectional views along sectional planes that are perpendicular to each other.

Two n+-doped impurity regions may be formed within a semiconductor substrate 600. The impurity regions may be source/drain-regions 601 of a MOS field effect transistor. A p-doped channel region 602 may separate the source/drain-regions 601. A gate electrode structure 695 may be disposed above the channel region 602. The gate electrode structure 695 may comprise an electrode film 630 that may be a n-doped polysilicon film. Stress amplifier films 621 and plating films 622 may be arranged on the electrode film 630 in alternating order. On a top plating film 622 an insulating cap layer 650 may be provided. Sidewall spacers 640 may extend along the vertical sidewalls of the resulting laminated electrode film stack and a gate dielectric 610 may separate the electrode film 630 and the channel region 602. The stress amplifier and plating films 621, 622 are bowed towards substrate 600 in order to increase the interface area and to increase the stress induced by the bi-layer. The bowing along the cross-sectional plane of FIG. 6A corresponds to the bowing along the cross-sectional plane of FIG. 6B such that the effect of the bowing is effective along and crosswise to the channel direction. Both strain components may improve the electron mobility and the $R_{DSON}$ characteristic.

Figure 7A:
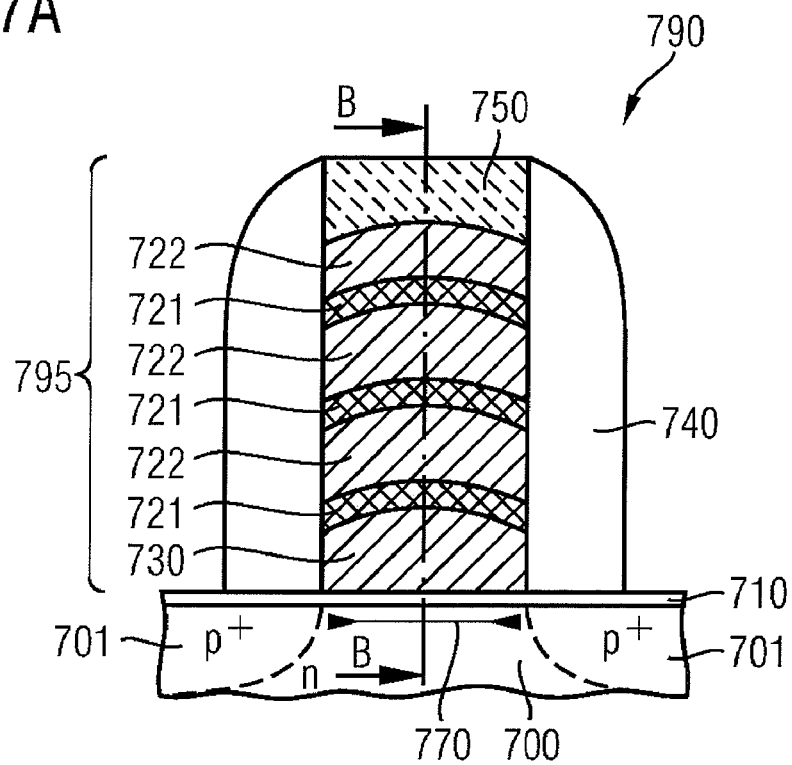
FIGS. 7A and 7B illustrate two corresponding cross-sectional views of a gate electrode structure and a MOSFET with plating films bowed along one axis according to a further embodiment.
Figure 7B:
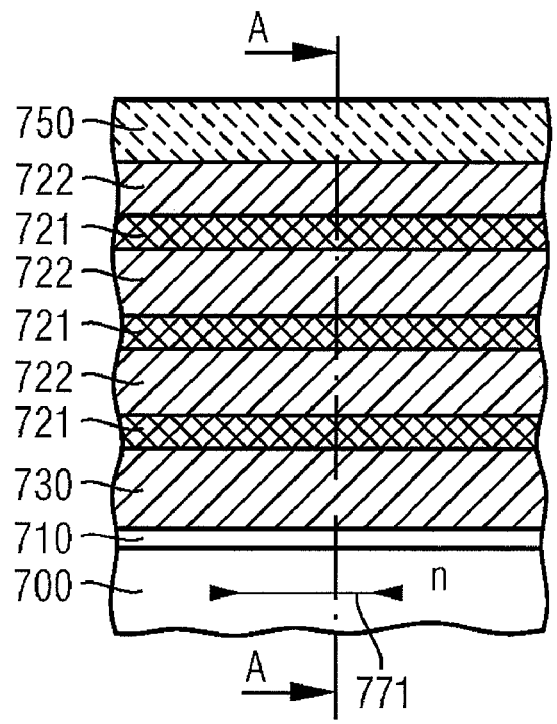

FIGS. 7A to 7B refer to a further embodiment of a gate electrode structure 795 and a MOS field effect transistor 790. The gate electrode structure 795 differs from the gate electrode structure 695 as described in FIG. 6 in that the stress amplifier and plating films 721, 722 are bowed along one single axis only. According to this embodiment, the stress amplifier film 721 and plating film 722 are bowed towards a substrate 700 along the channel axis which is determined by the shortest connection between the two source/drain-regions 701. Along an axis perpendicular to the channel axis, the stress amplifier film 721 and plating film 722 are less bowed or not bowed as in p-type transistors, a compressive strain of the channel region crosswise to the channel region may decrease the hole mobility while a compressive strain along the channel direction may increase the hole mobility. Bowed stress amplifier and plating films may be provided by patterning sacrificial structures, forming sidewall spacers embedding the sacrificial structures, removing the sacrificial structures to form mold trenches between the sidewall spacers and then depositing the stress amplifier films and the precursor material in the mold trenches.

By controlling the bowing of the stress amplifier films and plating films 721, 722 along two perpendicular axes, the laminated film gate structure may be adapted to n-channel MOSFETs and p-channel MOSFETs with regard to different channel and lattice orientations. The laminated gate electrode structure may be combined with further strained-silicon techniques, e.g., SiGe/SiC-source/drain-regions, SiGe-channel regions, stress inducing liners, compressive/tensile etch stop layer, stress memory technique and others.

Figure 8:
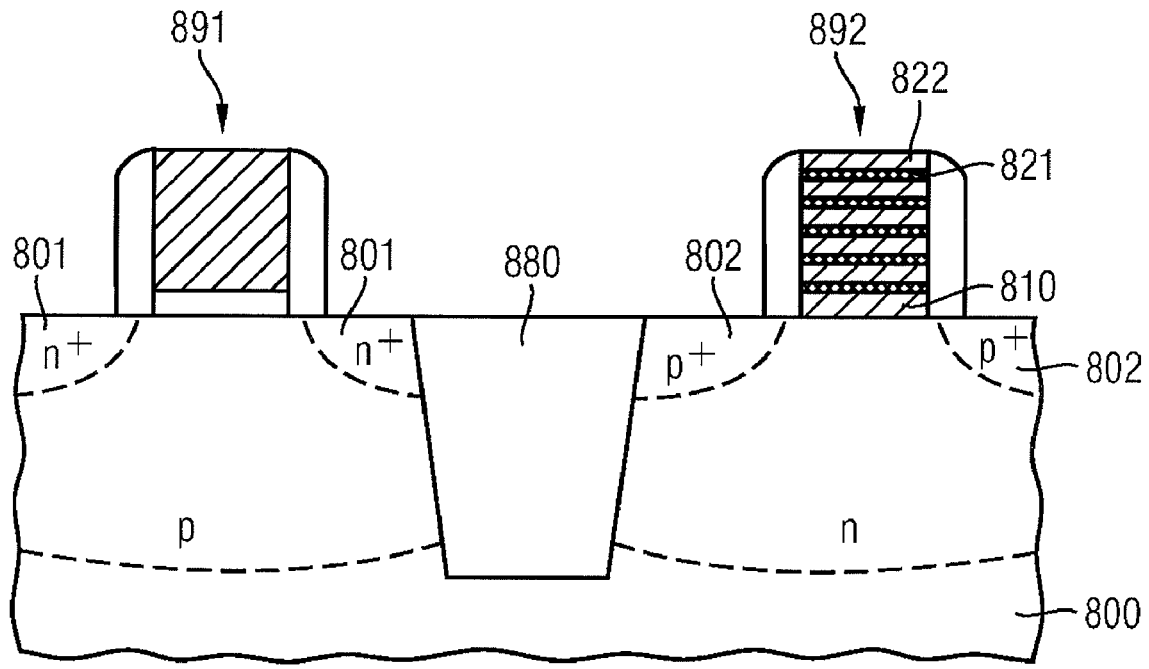
FIG. 8 is a schematic cross-sectional view of a field effect transistor arrangement comprising an n-channel MOSFET and a p-channel MOSFET according to a further embodiment.

FIG. 8 shows an arrangement comprising an n-channel MOSFET 891 and a p-channel MOSFET 892. Both transistors 891, 892 are provided on a pattern surface of a semiconductor substrate 800. An upper section of the semiconductor substrate 800 beneath the n-channel transistor 891 is p-doped, another portion of the semiconductor substrate 800 beneath the transistor 892 is n-doped. Two n-doped source/drain-regions 801 of the first transistor 891 are formed in the p-doped section and two p-doped source/drain regions 802 of the second transistor are formed within the n-doped section. The p-channel transistor 892 comprises a laminated gate electrode structure comprising stress amplifier films 821 and plating films 822 in alternating order. The n-channel transistor 891 may show a single layer gate structure. A shallow trench isolation structure 880 is formed in a trench that separates the n-channel transistor 891 and the p-channel transistor 892.

The channel region of the second transistor 892 may exhibit a compressive strain resulting from the laminated gate structure as described above. The channel region of the n-channel transistor 891 may exhibit a tensile stress resulting from the shallow trench isolation structure 880. For this purpose, the shallow trench isolation structure 880 may result from filling the trench with an insulator material and then densifying the insulator material by outgassing volatile components, wherein the densified insulator material induces a tensile stress in the neighboring substrate sections.

Figure 9:
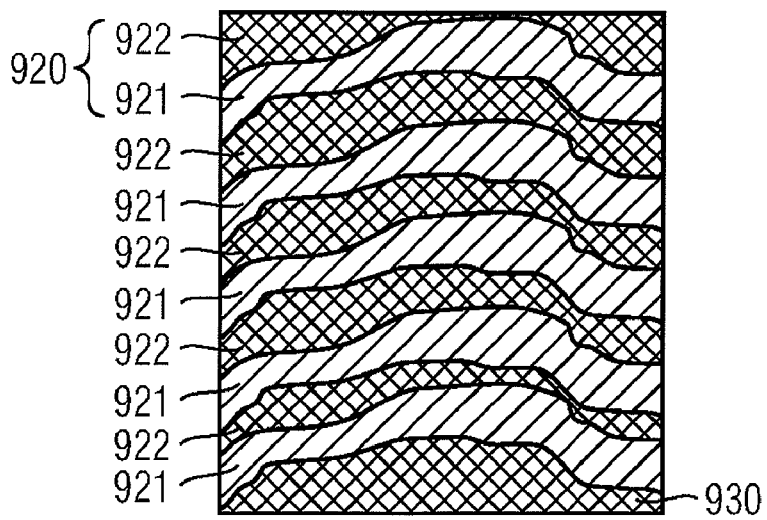
FIG. 9 is a schematic cross-sectional view of a portion of a gate electrode structure with bowed plating films according to a further embodiment.

FIG. 9 refers to a method of manufacturing a laminated gate structure with bowed stress amplifier films 921 and plating films 922. An electrode film 930 is deposited under predetermined conditions such that, in the centre of the gate electrode structure, more material is deposited than along the edges. In the following the stress amplifier films 921 and plating films 922 are deposited, for example via conformal deposition methods.

Figure 10:
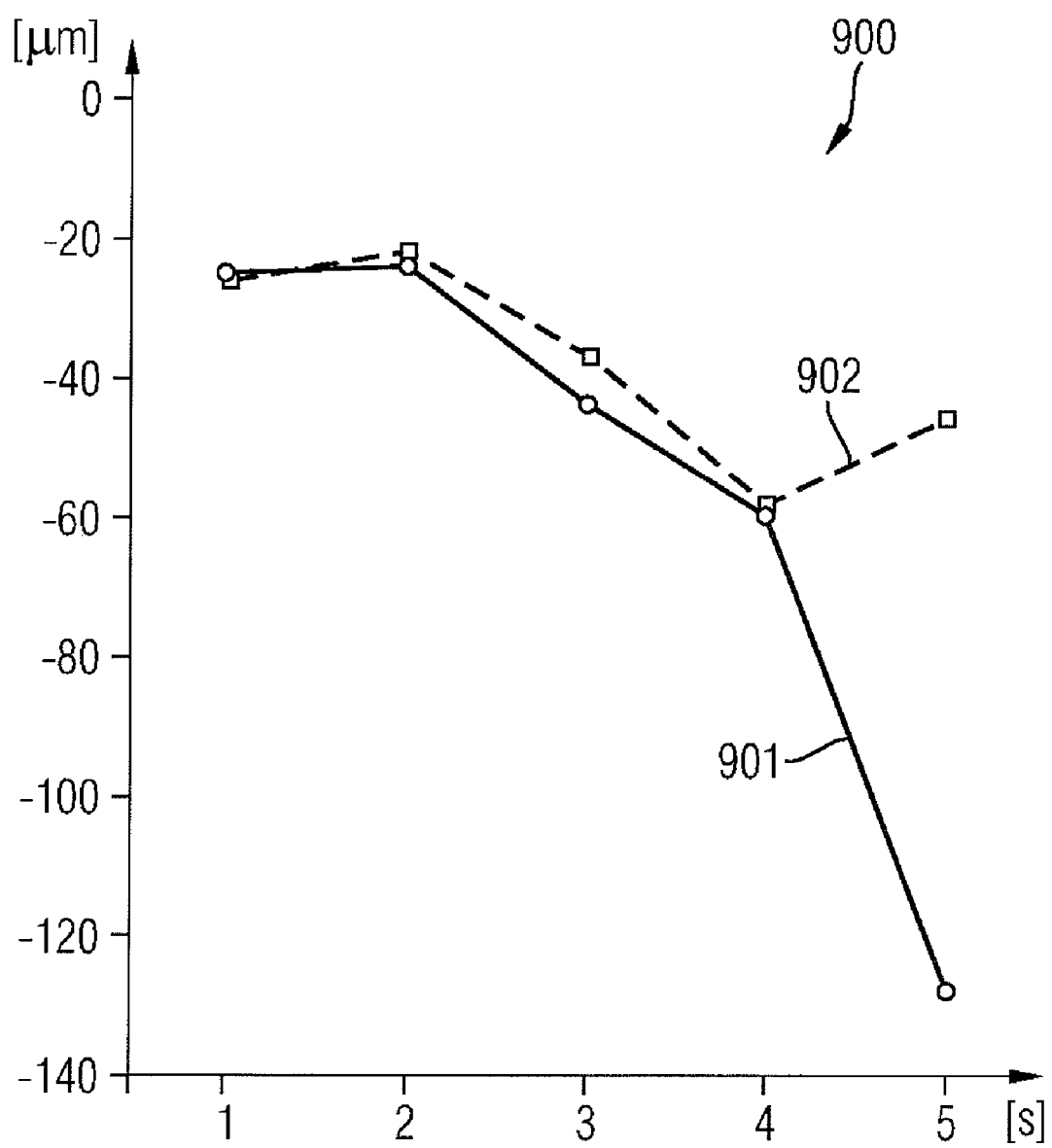
FIG. 10 is a diagram illustrating the stress induced in a substrate by various layers in dependence on the layer order for illustrating the effects of the embodiments.

FIG. 10 is a diagram illustrating the stress amplifier effect. The diagram plots a bowing of a bi-layer wafer 901 and a reference wafer 902 in dependence on the corresponding process. First, the deposition of a titanium nitride layer is performed. The bowing of each wafer is about −20 micrometers. On the reference wafer, represented by curve 902, a silicon oxy-nitride liner is subsequently deposited on the titanium nitride liner. The bi-layer wafer, represented by curve 901, is subsequently exposed to an equivalent annealing process. The bowing of both wafers 901, 902 is hardly influenced by the deposition of the silicon oxide nitride liner. Thereafter, a deposition of a first polysilicon layer on the reference and the bi-layer wafers 902, 901 is performed. The deposition of the first polysilicon layers results in increased bowing of the respective wafer. The extent of the bowing is independent from the material of the underlying layer which is titanium nitride in case of the bi-layer wafer 901 and silicon oxy-nitride in case of the reference wafer 902. A second polysilicon layer is subsequently deposited on the first polysilicon layer, resulting in further increased bowing of both wafers 901, 902.

Up to this point, the bowing of and the stress induced in the wafers 901, 902 by the polysilicon layer may be explained by deposition effects. Thereafter, a thermal anneal is performed that recrystallizes the deposited polysilicon layers. In case of the reference wafer 902, the bowing is reduced, while in case of the bi-layer wafer 901 the bowing is substantially amplified. The silicon oxy-nitride layer separating the titanium nitride layer and the polysilicon layer on the reference wafer 902 suppresses an interaction between the titanium nitride layer and the recrystallizating polysilicon. The substantially increased strain in the bi-layer wafer 901 cannot be explained by conventional deposition effects.

Figure 11:
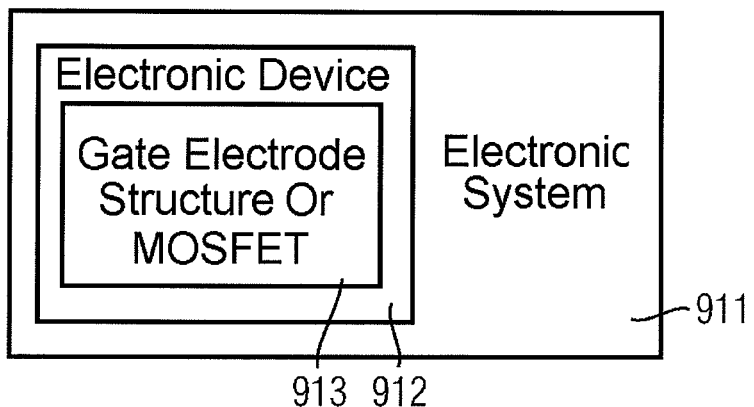
FIG. 11 is a schematic illustration of a system according to another embodiment.

FIG. 11 is a schematic illustration of an electronic system 911. The electronic system comprises an electronic device 912. The electronic device 912 may include a gate electrode structure or a MOS field effect transistor as described above. The electronic system 911 may be an audio system, a video system, a graphic card of a computer system, a computer system, e.g., a server, a communication system, e.g., a cellular phone, an imaging system, e.g., a digital camera, a data storage system, e.g., a date storage module for computer systems, a portable data storage device or a digital processing system such as a processor.

Figure 12:
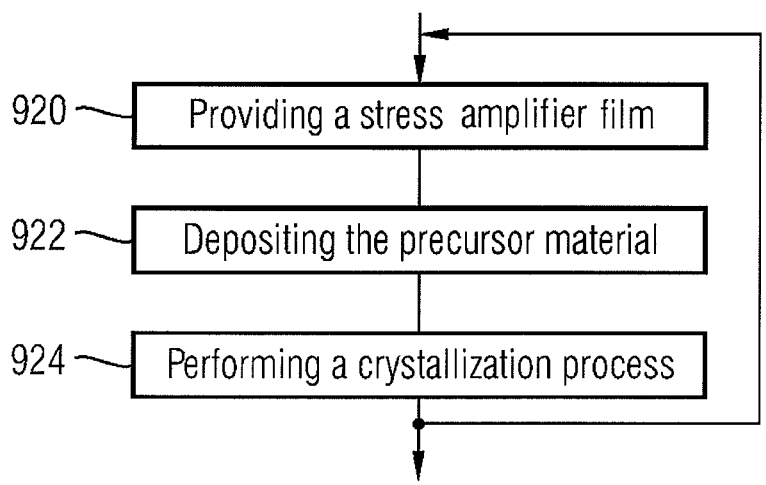
FIG. 12 is a simplified flow chart of a method of manufacturing a gate electrode structure according to another embodiment.

FIG. 12 is a simplified flow chart of a method of manufacturing a gate electrode structure. A stress amplifier film is provided, wherein the stress amplifier film is capable of determining a crystallization result of a precursor material (920). Thereafter, the precursor material is deposited on the stress amplifier film (922). A crystallization process is performed, such that, from the precursor material, a plating film of a polycrystalline material is formed (924). The precursor material crystallizes in a way such that a mechanical stress in the plating layer is amplified. Providing a stress amplifier film (920), depositing a precursor material (922) and performing a crystallization process (924), which may be, e.g., a thermal treatment, may be repeated at least one time.

Figure 13:
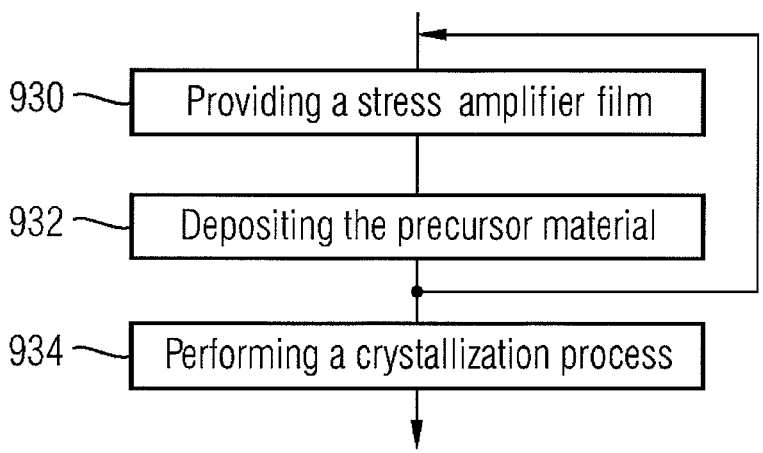
FIG. 13 is a simplified flowchart of a method of manufacturing a gate electrode structure according to another embodiment.

FIG. 13 refers to another method of manufacturing a gate electrode structure. A stress amplifier film is provided that is capable of determining a crystallization result of a precursor material (930). The precursor material is deposited on the stress amplifier film (932). The process of providing a stress amplifier film (930) and depositing a precursor material (932) is repeated at least one time. Subsequently, a crystallization process is performed (934). A plating film of a polycrystalline material results from the precursor material, such that the precursor material crystallizes in a way such that a mechanical strain in the plating layer is amplified.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An integrated circuit including a transistor, the transistor comprising a gate electrode structure, comprising:
    a plurality of bi-layers, each of the bi-layers including:
        a plating film comprising a polycrystalline material; and
        a stress amplifier film configured to affect a crystalline structure of the polycrystalline material, the stress amplifier film having a thickness between 2 to 10 nanometers, wherein:
    the bi-layers are arranged to form a laminated film stack with alternating stress amplifier and plating films; and
    the stress amplifier film of an upper bi-layer is in contact with the plating film of a lower bi-layer and is in contact with the plating film of the upper bi-layer.

2. The integrated circuit of claim 1, wherein the number of bi-layers is between two and ten, inclusive.

3. The integrated circuit of claim 1, wherein the polycrystalline material is polysilicon.

4. The integrated circuit of claim 1, further comprising:
    a gate dielectric film below the bi-layers, the gate dielectric film being in contact with the stress amplifier film of a lowest bi-layer.

5. The integrated circuit of claim 1, further comprising:
    a conductive electrode film and a gate dielectric film, wherein the conductive electrode film is disposed between the gate dielectric film and the stress amplifier film of a lowest bi-layer, and wherein the conductive electrode film is in contact with the gate dielectric film and the stress amplifier film of a lowest bi-layer.

6. The integrated circuit of claim 5, wherein the polycrystalline material is n-doped polysilicon, and the electrode film has a work function of about 3.8 to 4.3 eV.

7. The integrated circuit of claim 5, wherein the polycrystalline material is p-doped polysilicon and the electrode film has a work function of about 4.4 to 5.3 eV.

8. The integrated circuit of claim 1, wherein the plating film has a thickness between 10 to 100 nanometers.

9. The integrated circuit of claim 1, wherein the stress amplifier film comprises amorphous carbon.

10. The integrated circuit of claim 1, wherein the stress amplifier film comprises a material selected from the group of conductive compounds including: Ti, Ta, W, Mo, Ru, Re, Zr and Hf.

11. The integrated circuit of claim 1, wherein the stress amplifier film comprises TiN.

12. The integrated circuit of claim 1, wherein the stress amplifier film is bowed, thereby enlarging an interface area between the stress amplifier film and the plating film.

13. The integrated circuit of claim 1, wherein the stress amplifier film is bowed along two perpendicular cross-sections parallel to a film stack axis;
    wherein an extent of the bowing along one of the two cross-sections is different from an extent of the bowing along the other of the two cross-sections.

14. An electronic system, comprising an integrated circuit, the integrated circuit including:
    a transistor comprising:
    a gate dielectric film;
    a conductive electrode film; and
    a gate electrode structure including:
        a plurality of bi-layers, each of the bi-layers including:
            a plating film including a polycrystalline material; and a stress amplifier film configured to affect a crystalline structure of the polycrystalline material, wherein:

the bi-layers are arranged to form a laminated film stack with alternating stress amplifier and plating films; and the conductive electrode film is disposed between the gate dielectric film and one of the stress amplifier films and is in contact with the gate dielectric film and the one of the stress amplifier films, respectively.

15. The electronic system of claim 14, wherein the electronic system is an audio system, a video system, a computer system, a game console, a communication system, a cellular phone, a data storage system, a data storage module, a graphic card or a portable storage device with an interface to a computer system, an audio system, a video system, a game console or a data storage system.

16. The electronic system of claim 14, wherein:

the transistor is a p-MOSFET; and a strain induced in a channel region of the transistor is a compressive strain.

17. An integrated circuit including a transistor, the transistor comprising a gate electrode structure, the gate electrode structure comprising:

a plurality of bi-layers, each of the bi-layers including:

a plating film comprising a polycrystalline material; and a stress amplifier film that is configured to cause a stress at an interface between the plating film and the stress amplifier film, resulting in a strain in the stress amplifier film;

wherein the stress amplifier film comprises amorphous carbon.

18. An integrated circuit including a transistor, the transistor comprising a gate electrode structure, the gate electrode structure comprising:

at least two bi-layers, each bi-layer including:

a plating film comprising a polycrystalline material; and a stress amplifier film, wherein the bi-layers are arranged to form a laminated film stack with alternating stress amplifier and plating films, the stress amplifier film of an upper bi-layer being in contact with the plating film of a lower bi-layer and being in contact with the plating film of the upper bi-layer.

19. The integrated circuit of claim 18, wherein the stress amplifying material is configured to affect a crystalline structure of the polycrystalline material of the plating film.

20. The integrated circuit of claim 18, wherein the stress amplifier film comprises a stress amplifying material selected from the group consisting of: amorphous carbon, Ti, a titanium containing compound, Ta, a tantalum containing compound, W, a tungsten containing compound, Mo, a molybdenum containing compound, Ru, a ruthenium containing compound, Re, a Rhenium containing compound, Zr, a zirconium containing compound, and Hf, a hafnium containing compound, wherein the stress amplifying material causes a stress at an interface between the plating film and the stress amplifier film, resulting in a strain in the stress amplifier film.

21. The integrated circuit of claim 17, wherein the stress amplifier film has a thickness of 2 to 10 nanometers.

22. The integrated circuit of claim 18, wherein the stress amplifier film has a thickness of 2 to 10 nanometers.

* * * * *